United States Patent
Ryu et al.

(10) Patent No.: US 7,485,569 B2
(45) Date of Patent: Feb. 3, 2009

(54) PRINTED CIRCUIT BOARD INCLUDING EMBEDDED CHIPS AND METHOD OF FABRICATING THE SAME

(75) Inventors: Chang Sup Ryu, Daejeon (KR); Doo Hwan Lee, Chungcheongbuk-do (KR); Jin Yong Ahn, Daejeon (KR); Myung Sam Kang, Daejeon (KR); Suk Hyeon Cho, Daejeon (KR)

(73) Assignee: Samsung Electro-Mechanics Co., Ltd., Kyunggi-do. Korea (KR)

( * ) Notice: Subject to any disclaimer, the term of this patent is extended or adjusted under 35 U.S.C. 154(b) by 443 days.

(21) Appl. No.: 11/137,345

(22) Filed: May 24, 2005

(65) Prior Publication Data
US 2006/0157832 A1     Jul. 20, 2006

(30) Foreign Application Priority Data
Dec. 30, 2004   (KR) .................. 10-2004-0116805

(51) Int. Cl.
*H01L 21/4763*     (2006.01)
(52) U.S. Cl. ................. 438/624; 438/623; 438/618; 438/612; 438/106; 257/757; 257/758; 257/759; 257/760; 257/E25.012; 257/E25.029; 257/E23.178
(58) Field of Classification Search ......... 438/624, 438/623, 618, 612, 108, 106; 257/757–760, 257/E25.029, E25.012, E23.178
See application file for complete search history.

(56) References Cited

U.S. PATENT DOCUMENTS 5,079,069 A    1/1992   Howard et al.
5,592,737 A    1/1997   Middelman et al.
6,606,793 B1   8/2003   Dunn
6,724,638 B1 * 4/2004   Inagaki et al. ............... 361/763

FOREIGN PATENT DOCUMENTS

| JP | 2000332387 A | * 11/2000 |
| JP | 2002-271038 | 9/2002 |
| JP | 2003-197849 | 7/2003 |
| JP | 2003-309373 | 10/2003 |
| JP | 2004-153084 | 5/2004 |
| JP | 2004-241405 | 8/2004 |

OTHER PUBLICATIONS

Patent Abstracts of Japan for 2004153084 A published on May 27, 2004.
Patent Abstracts of Japan for 2004007006 A published on Jan. 8, 2004.

* cited by examiner

*Primary Examiner*—Lynne A. Gurley
*Assistant Examiner*—Junghwa M Im
(74) *Attorney, Agent, or Firm*—Darby & Darby P.c.

(57) ABSTRACT

A printed circuit board having embedded chips, composed of a central layer having an embedded chip, an insulating layer formed on one surface or both surfaces of the central layer and having a via hole filled with conductive ink, and a circuit layer formed on the insulating layer and having a via hole and a circuit pattern electrically connected to the chip of the central layer through the via hole of the insulating layer. In addition, a method of fabricating a printed circuit board including embedded chips is provided.

10 Claims, 18 Drawing Sheets

PRINTED CIRCUIT BOARD INCLUDING EMBEDDED CHIPS AND METHOD OF FABRICATING THE SAME

INCORPORATION BY REFERENCE

The present application claims priority under 35 U.S.C. §119 to Korean Patent Application No. 2004-116805 filed on Dec. 30, 2004. The content of the application is incorporated herein by reference in its entirety.

BACKGROUND OF THE INVENTION

1. Field of the Invention

The present invention relates, generally, to a printed circuit board (PCB) including embedded chips, and a fabricating method thereof. More particularly, the present invention relates to a PCB including embedded chips, which comprises a central layer having an embedded chip, an insulating layer formed on one surface or both surfaces of the central layer and having a through hole filled with conductive ink, and a circuit layer formed on the insulating layer and having a via hole and a circuit pattern electrically connected to the chip of the central layer through the through hole of the insulating layer, and a method of fabricating such a PCB. The method of fabricating the PCB according to the present invention includes forming a circuit layer having a predetermined circuit pattern, vertically forming a via hole through a base substrate having a cured resin layer and a non-cured resin layer, filling the via hole with conductive ink, instead of a plating process, superimposing a passive component or an active component on the base substrate, and heating and compressing the circuit layers and the insulating layers on the base substrate at one time, to manufacture a multi-layered PCB.

2. Description of the Related Art

With the great improvement of electronic industries, to correspond to electronic products requiring miniaturization and high functionality, electronic technologies have been developed to insert resistors, capacitors, ICs (integrated circuits), etc., into substrates.

Although discrete chip resistors or discrete chip capacitors have long since been mounted on PCBs, PCBs including embedded chips, such as resistors or capacitors, have only recently been developed.

In techniques of manufacturing PCBs including embedded chips, the chips, such as resistors or capacitors, are inserted into an outer layer or an inner layer of the substrate using novel materials and processes, to substitute for conventional chip resistors and chip capacitors.

That is, the PCB including embedded chips means that the chips, for example, capacitors, are embedded in the inner layer of the substrate itself or outer layer thereof. Regardless of the size of the substrate itself, if the chip is incorporated into the PCB, this is called an 'embedded chip'. Such a substrate is referred to as an 'embedded chip PCB'.

The major characteristic of the embedded chip PCB is that the chip is intrinsically provided in the PCB without the need to mount the chip on the substrate.

In general, fabrication techniques of the embedded chip PCB are largely classified into three types.

First, a method of manufacturing a polymer thick film type capacitor is provided, including applying a polymer capacitor paste, which is then heat cured, that is, dried. Specifically, this method includes applying a polymer capacitor paste onto an inner layer of a PCB, and drying the polymer capacitor paste, on which a copper paste is then printed and dried, to form electrodes, thereby obtaining an embedded capacitor.

Second, a method of manufacturing an embedded discrete type capacitor is provided, including coating a PCB with a ceramic filled photosensitive resin, which has been patented by Motorola Co. Ltd., USA (U.S. Pat. No. 6,606,793). The above method includes applying the photosensitive resin containing ceramic powder on the substrate, laminating a copper foil layer on the resin layer to form upper electrodes and lower electrodes, forming a circuit pattern, and then etching the photosensitive resin, thereby obtaining a discrete capacitor.

Third, a method of manufacturing an embedded capacitor is provided, including separately inserting a dielectric layer having capacitance properties into an inner layer of a PCB, so as to substitute for a decoupling capacitor mounted on a PCB, which has been patented by Zycon Corp. Ltd., USA (U.S. Pat. No. 5,079,069). In this method, the dielectric layer having power electrodes and ground electrodes is inserted into the inner layer of the PCB, thereby obtaining a power distributed decoupling capacitor.

To fulfill various functions and superb performance of electronic products, higher speed electronic components are increasingly required. Also, with the aim of increasing the speed of the component, a package bonding manner is changed from typical bonding manners, such as lead frame, wire bonding, pin type bonding, etc., into a small ball type bonding manner or a flip-chip bonding manner.

In the case of a high speed product that adopts a flip-chip bonding manner or in the case of a central processing unit (CPU) or a graphic chip set, a clock is operated at a speed of 2 GHz or more.

Such a CPU or chip set requires a short signal rising time and a high current, and is designed to further decrease intervals between signal lines of an IC, flip chip package and a main board for operation at high speeds.

However, as the speed of the component increases, voltage fluctuation of a power line occurs, resulting in the generation of a lot of high frequency noise, such as SSN (Simultaneous Switching Noise) or delta-I ($\Delta$I).

The high frequency noise (e.g., SSN) causes system delay or a logic fault, thereby decreasing the performance and reliability of the system.

Therefore, the SSN may be effectively reduced by lowering the inductance of the power line when the current and the switching speed required for the operation of devices are unchangeable. In addition, the decoupling capacitor is used to reduce the voltage fluctuation of the power line.

The decoupling chip capacitor is mounted to the power line, whereby a current required for switching the circuit can be directly fed. Thus, the inductance of the power line is shielded, and hence, a voltage drop phenomenon is remarkably lowered and the SSN may be reduced, too.

FIGS. 1a to 1f sequentially show a process of fabricating a PCB including embedded chips, according to a first conventional technique, which is disclosed in Japanese Patent Laid-open Publication No. 2004-7006.

In FIG. 1a, an insulating layer 1 is processed to have a hollow portion 3 therethrough, and also, through holes 2 are formed through the insulating layer 1 and filled with conductive ink.

In FIG. 1b, a circuit forming process is performed on a protective film 6, and thus, a predetermined circuit pattern 4 is formed thereon.

In FIG. 1c, an electrical component 5 is mounted on the circuit pattern 4.

In FIG. 1d, the insulating layer 1 having the through holes 2 filled with the conductive ink adheres to the circuit pattern 4.

In FIG. 1e, the protective film 6 is removed from the circuit pattern 4, to form a central layer 1.

In FIG. 1f, circuit layers 7 and 8 having predetermined circuit patterns 9 and via holes 11 filled with conductive ink are formed, and then laminated on both surfaces of the central layer 1.

FIGS. 2a to 2d sequentially show a process of fabricating a PCB including embedded chips, according to a second conventional technique, which is disclosed in Japanese Patent Laid-open Publication No. 2004-7006.

In FIG. 2a, a circuit layer 20 having a predetermined circuit pattern 22 and through holes 21 is formed.

In FIG. 2b, an electrical component 23 is mounted on the predetermined circuit pattern 22 of the circuit layer 20.

In FIG. 2c, a hollow portion of a central layer 25 is formed, after which the central layer 25 is processed to have a predetermined circuit pattern 26 and through holes 27 and is then laminated on the circuit layer 20.

In FIG. 2d, a circuit layer 28 having a predetermined circuit pattern 29 and through holes 30 is formed and laminated on the central layer 25.

In such cases, the first and second conventional techniques are disadvantageous because the space between the electrical component and the insulating layer as the central layer is large, and thus, the resultant product has a large size.

Further, the first and second conventional techniques are disadvantageous because the space between the chip and the copper foil layer is large, and thus, efficient radiating effects cannot be obtained.

Furthermore, the second conventional technique is disadvantageous because a build-up process used for lamination takes a long time.

Turning now to FIG. 3a, constitutive layers of a PCB including embedded chips upon lamination are schematically shown, according to a third conventional technique. Also, FIGS. 3b to 3f sequentially show a process of forming a core of each layer of FIG. 3a. The above technique is disclosed in Japanese Patent Laid-open Publication No. 2004-153084.

In FIG. 3a, a lower circuit layer is composed of a film 8 having a predetermined circuit pattern 3 and a radiating pattern 6, in which conductive ink 9 is applied on the radiating pattern 6.

Then, a hollow portion is formed through a film 8 and then the film 8 is further processed to have a predetermined circuit pattern 3 and through holes filled with conductive ink 9, to obtain a central layer. As such, the film 8 is provided in the number of layers corresponding to the thickness of an electrical component 5 to be inserted into the hollow portion thereof.

Finally, an upper circuit layer is formed by processing a film 8 to have a predetermined circuit pattern 3 and through holes filled with conductive ink 9, and then the upper and lower circuit layers are laminated on the central layer having an inserted electrical component 5 at one time.

In FIG. 3b, to form a core of each layer, a copper foil layer 10 is laminated on a film 8.

In FIG. 3c, the copper foil layer 10 on the film 8 is subjected to a general circuit forming process to form a circuit pattern 3. A protective film 11 is applied on a lower surface of the film 8.

In FIG. 3d, through holes 8a are formed at positions corresponding to the upper circuit pattern 3 on the film 8 and the protective film 11.

In FIG. 3e, the through holes 8a are filled with conductive ink 9.

In FIG. 3f, the protective film 11 is removed from the film 8.

However, the third conventional technique is disadvantageous in that because the through holes filled with conductive ink adhere to the chip upon simultaneous lamination, the alignment of the layers cannot be accurately controlled.

Moreover, since the radiation takes place using the radiating pattern, limitations are imposed on fabricating a high density circuit due to the formation of a passage required for emission of the radiating pattern.

SUMMARY OF THE INVENTION

Accordingly, the present invention has been made keeping in mind the above problems occurring in the related art, and an object of the present invention is to provide a multi-layered PCB including embedded chips, and a method of fabricating the same, in which interlayer electrical connection is realized while constitutive layers of the PCB having chips such as active and passive components are simultaneously laminated, thereby drastically decreasing the number of processes.

Another object of the present invention is to provide a multi-layered PCB including embedded chips and a method of fabricating the same, in which the positions of the chips embedded in the PCB are fixed, and thus, are not moved even upon compression, whereby a highly reliable PCB can be obtained.

In order to accomplish the above objects, the present invention provides a method of fabricating a printed circuit board including embedded chips, including the steps of preparing a circuit layer having a circuit pattern on one surface or both surfaces thereof; forming an insulating layer having a via hole filled with conductive ink; preparing a copper clad laminate having a hollow portion into which a chip is to be inserted; preparing a material layer including an insulating layer and a copper foil layer; pre-laminating the circuit layer, the insulating layer, the chip, the copper clad laminate, and the material layer on the insulating layer; and compressing the pre-laminated layers, whereby the chip is connected to the circuit pattern of the circuit layer and the copper foil layer of the material layer through the via hole.

In accordance with an embodiment of the present invention, a method of fabricating a printed circuit board including embedded chips is provided, which includes the steps of forming a circuit layer having a circuit pattern on one surface or both surfaces thereof; forming an insulating layer having a via hole filled with conductive ink; preparing a material layer having a non-cured resin layer and a copper foil layer; pre-laminating a chip on a portion filled with the conductive ink; pre-laminating the circuit layer and the material layer on the insulating layer; and compressing the pre-laminated layers, whereby the chip is connected to the circuit pattern of the circuit layer through the via hole, and the chip is inserted into the non-cured resin layer of the material layer.

In accordance with another embodiment of the present invention, a method of fabricating a printed circuit board including embedded chips is provided, which includes the steps of forming a central layer having an embedded chip; forming an insulating layer having a via hole filled with conductive ink; forming a circuit layer having a via hole and a circuit pattern; pre-laminating the central layer, the insulating layer, and the circuit layer; and compressing the pre-laminated layers, whereby the chip of the central layer is connected to the circuit pattern of the circuit layer through the via hole.

Further, the present invention provides a printed circuit board including embedded chips, which includes a central layer having an embedded chip; an insulating layer formed on one surface or both surfaces of the central layer and having a through hole filled with conductive ink; and a circuit layer formed on the insulating layer and having a via hole and a circuit pattern electrically connected to the chip of the central layer through the through hole of the insulating layer.

BRIEF DESCRIPTION OF THE DRAWINGS

The above and other objects, features and advantages of the present invention will be more clearly understood from the following detailed description taken in conjunction with the accompanying drawings, in which:

FIGS. 3b to 3f are sectional views sequentially showing a process of fabricating a core of each layer of FIG. 3a;

DETAILED DESCRIPTION OF THE INVENTION

Hereinafter, embodiments of the present invention are described, with reference to the appended drawings.

FIGS. 4a to 4d sequentially show a process of fabricating a circuit layer of a PCB including embedded chips, according to an embodiment of the present invention.

Figure 1A:
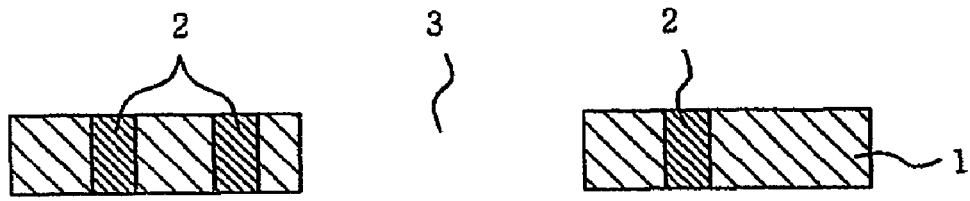
FIGS. 1a to 1f are sectional views sequentially showing a process of fabricating a PCB including embedded chips, according to a first conventional technique.
Figure 1B:
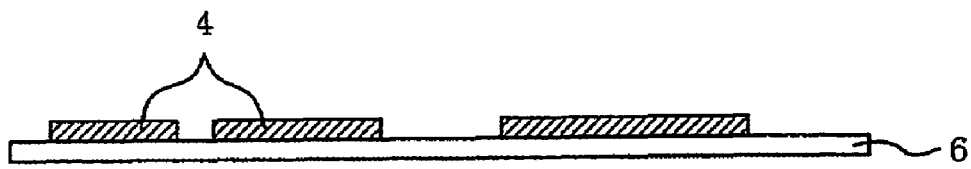
Figure 1C:
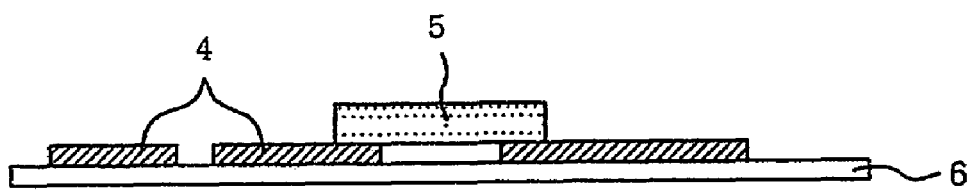
Figure 1D:
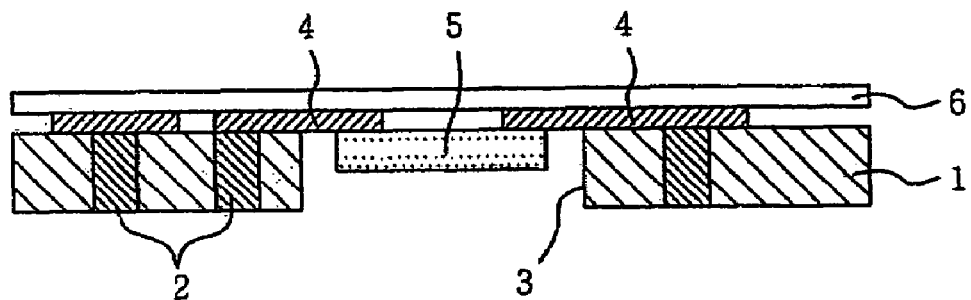
Figure 1E:
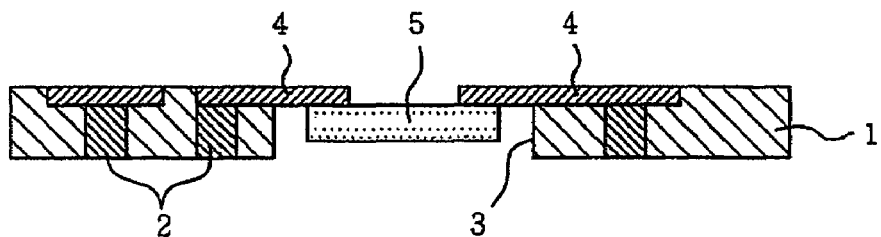
Figure 1F:
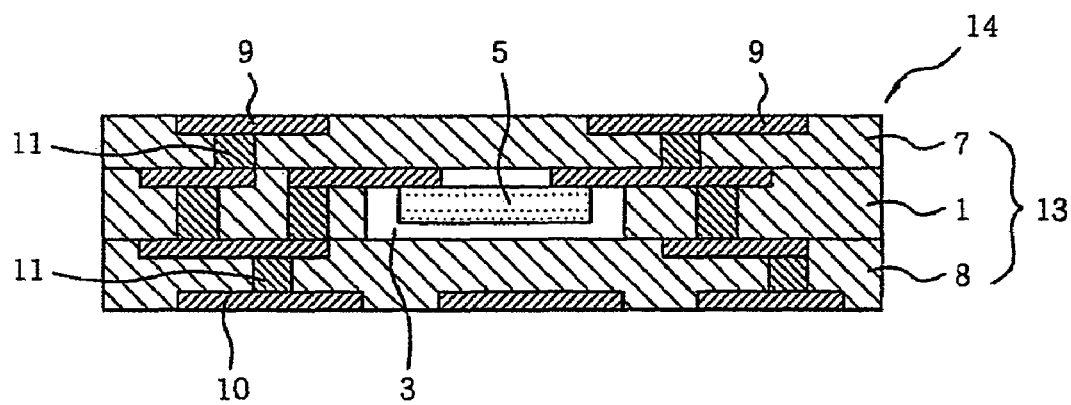
Figure 2A:
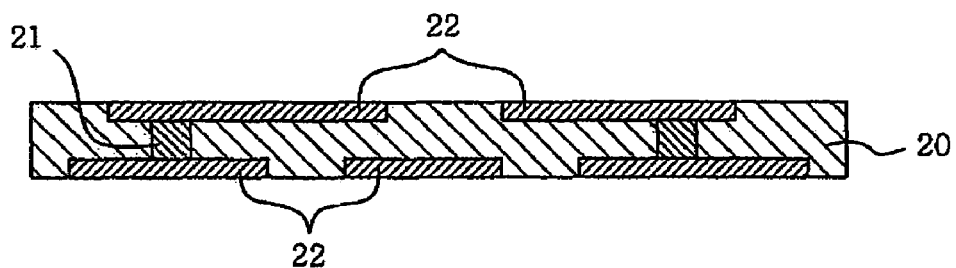
FIGS. 2a to 2d are sectional views sequentially showing a process of fabricating a PCB including embedded chips, according to a second conventional technique.
Figure 2B:
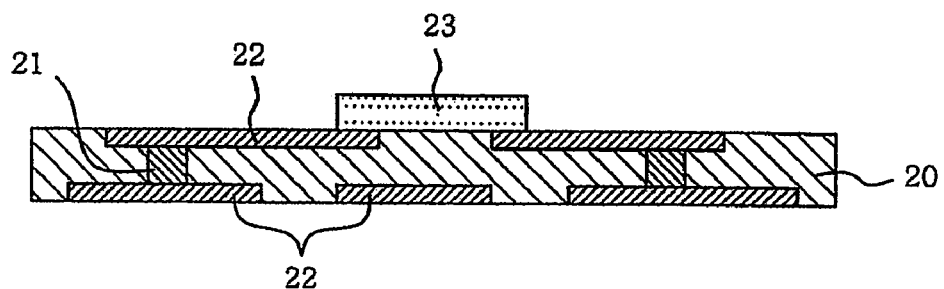
Figure 2C:
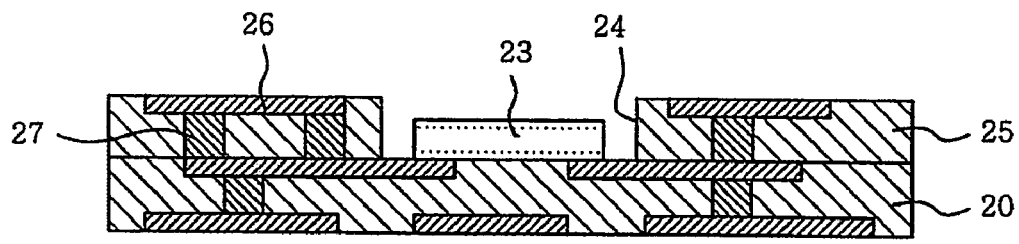
Figure 2D:
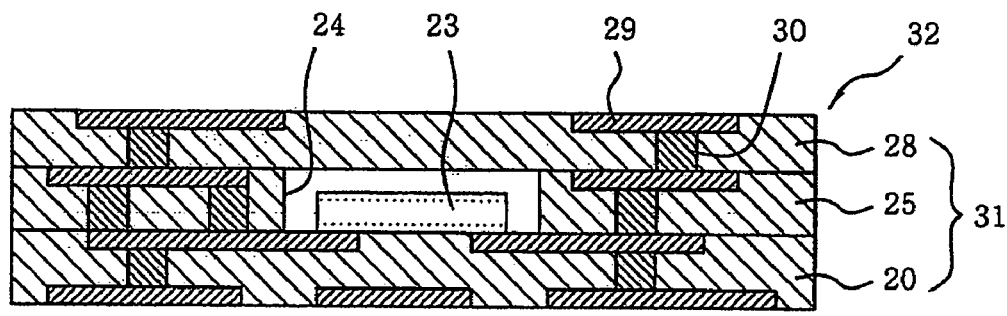
Figure 3A:
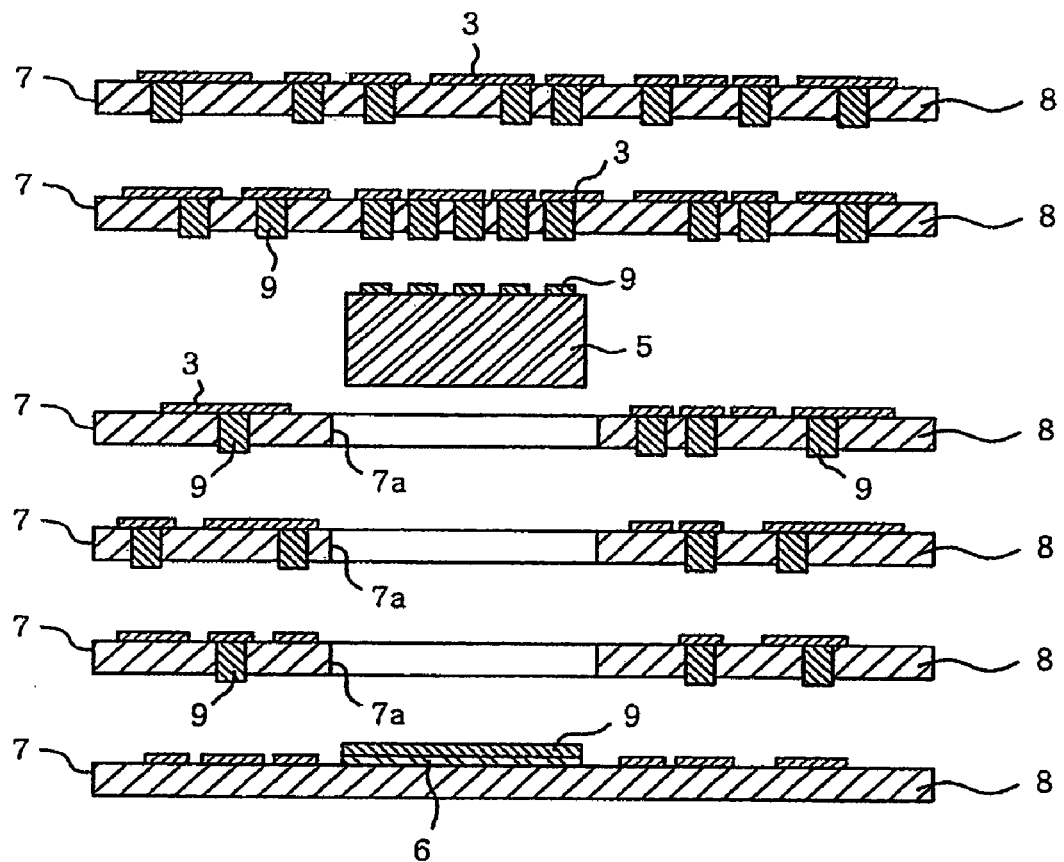
FIG. 3a is sectional views schematically showing constitutive layers of a PCB including embedded chips upon lamination, according to a third conventional technique.
Figure 3B:
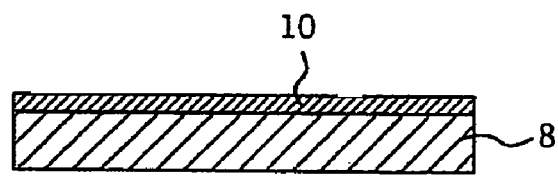
Figure 3C:
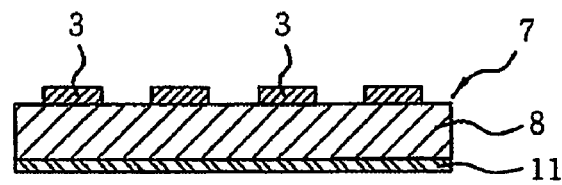
Figure 3D:
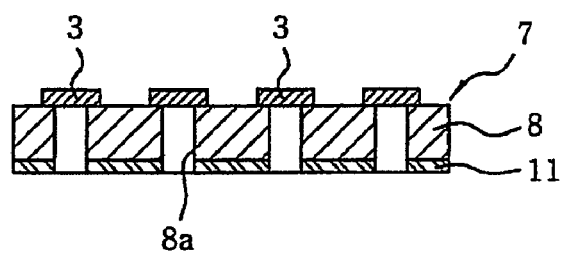
Figure 3E:
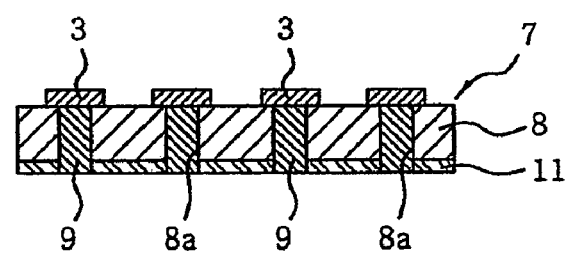
Figure 3F:
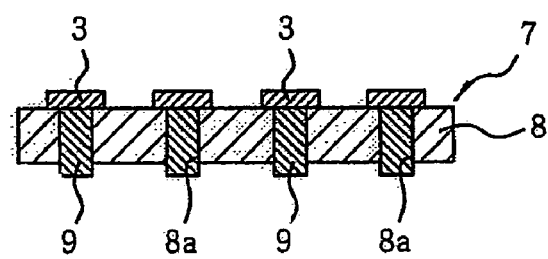
Figure 4A:
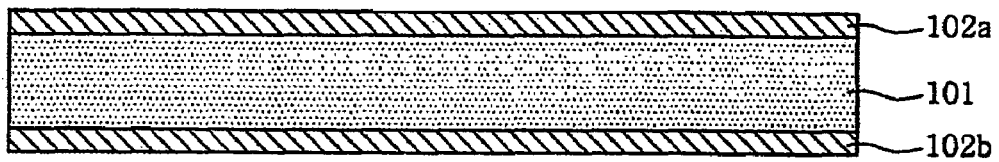
FIGS. 4a to 4d are sectional views sequentially showing a process of fabricating a circuit layer of a PCB including embedded chips, according to an embodiment of the present invention.

In FIG. 4a, a copper clad laminate (CCL) having an insulating resin layer 101 and copper foil layers 102a and 102b formed on both surfaces thereof is prepared.

In this case, the CCL having the insulating resin layer 101 and the copper foil layers 102a and 102b formed on both surfaces thereof is exemplified by glass/epoxy CCLs, heat resistant resin CCLs, paper/phenol CCLs, high frequency CCLs, flexible CCLs, complex CCLs, etc., depending on its uses.

Figure 4B:
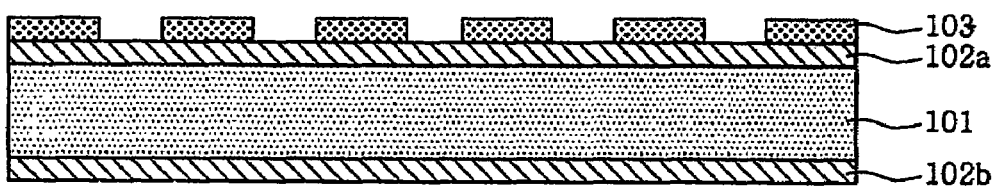

In FIG. 4b, an etching resist 103 is applied on one surface of the CCL having the insulating resin layer 101 and the copper foil layers 102a and 102b formed on both surfaces thereof, and then exposed to light, to form an etching resist pattern. At this time, a dry film is used as the etching resist 103. Alternatively, as the etching resist 103, a liquid photosensitive agent may be used. Such a photosensitive agent, which is sprayed on the CCL, may be more thinly applied than the dry film, thereby forming a finer circuit pattern. In the case where the surface of the substrate is uneven, the uneven surface of the substrate may be filled with the above liquid photosensitive agent, thus obtaining the uniform substrate surface.

Figure 4C:
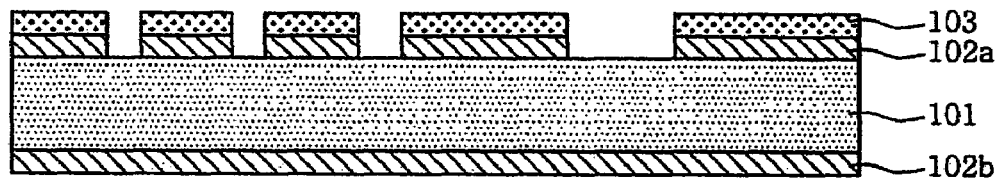

In FIG. 4c, the copper foil layer 102a on one surface of the substrate is etched, to form a circuit pattern.

Figure 4D:
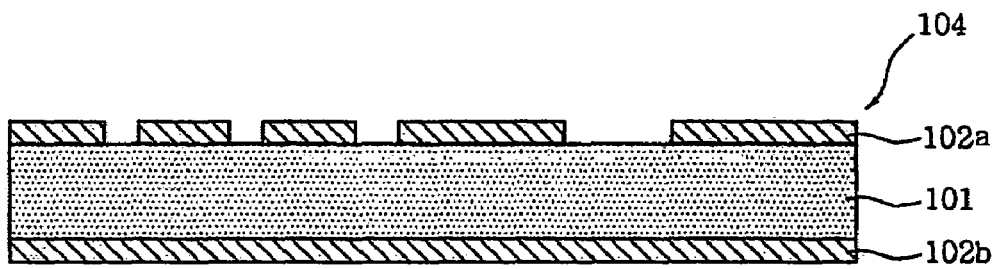

In FIG. 4d, the etching resist 103 is released from the copper foil layer 102a, thereby obtaining a circuit layer 104 having a circuit pattern on one surface thereof.

FIGS. 5a to 5e sequentially show a process of fabricating an insulating layer of the PCB, according to the present embodiment of the invention.

Figure 5A:
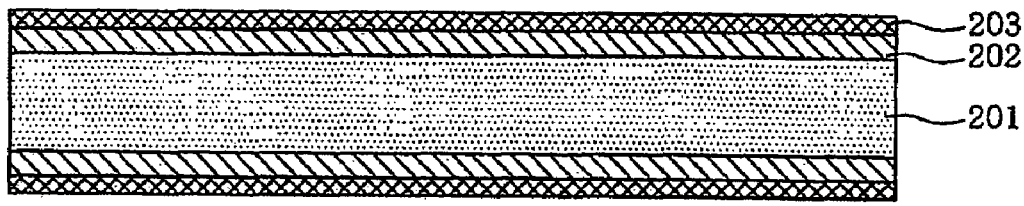
FIGS. 5a to 5e are sectional views sequentially showing a process of fabricating an insulating layer of the PCB, according to an embodiment of the present invention.

In FIG. 5a, a base substrate including a cured resin layer 201, non-cured resin layers 202 formed on both surfaces of the cured resin layer 201, and protective films 203 formed on the non-cured resin layers 202 is prepared. The cured resin layer 201 is formed of a C-stage resin, while the non-cured resin layer 202 is formed of a B-stage resin and is cured into a C-stage when being heated. The protective film 203 is a removable adhesive film, and should have a thickness suitable for formation of a protrusion of conductive ink, as stated below.

Figure 5B:
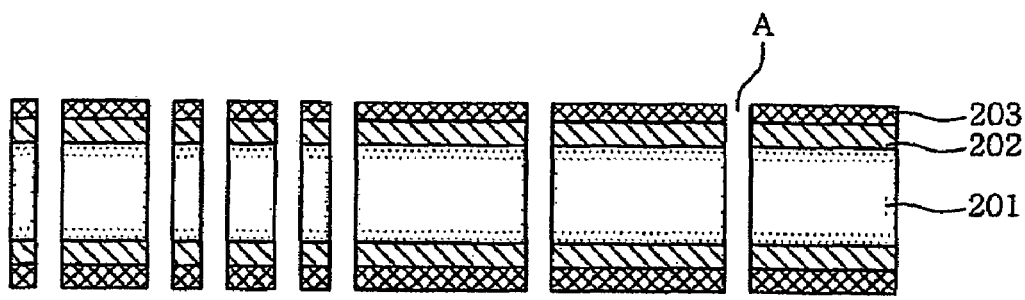

In FIG. 5b, via holes A are formed through the base substrate. The via hole A functions to electrically connect the layers, and thus, is formed at a portion for interlayer conduction. Further, the via hole A should be formed at a portion corresponding to a connection pad of a chip, as stated below. Although the via hole A is preferably machined by use of a laser drilling process to obtain a fine and precise via hole A, a CNC drill may be used.

Figure 5C:
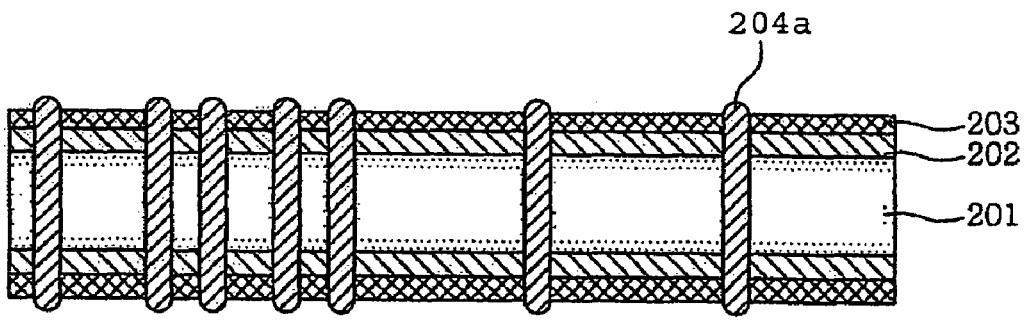

In FIG. 5c, the via hole A is filled with conductive ink 204a. As such, a filling manner of pushing conductive ink into a via hole A using a squeegee is preferably used. Thereby, interlayer electrical connection is realized by the conductive ink that fills the via hole A.

Figure 5D:
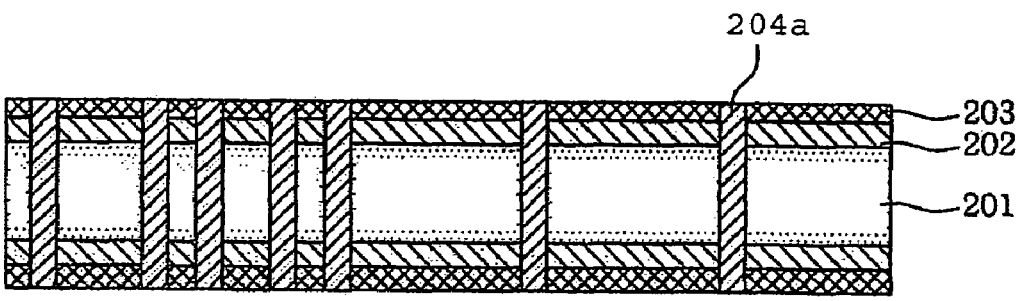

As is apparent from FIG. 5c, when the via hole A is filled with the conductive ink 204a, the conductive ink projects from the protective film 203. Since the conductive ink 204a projecting from the protective film 203 reduces the accuracy of the following processes and causes the fabrication of unreliable products, it is removed by a polishing process, thus obtaining an even substrate surface, as shown in FIG. 5d.

Figure 5E:
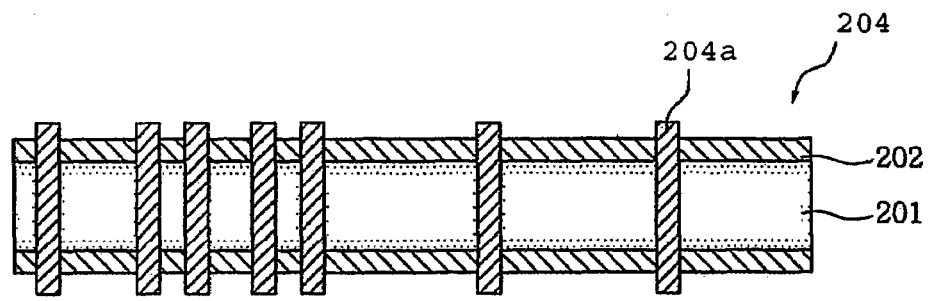

In FIG. 5e, the protective films 203 are removed from both surfaces of the substrate, to complete an insulating layer 204. The insulating layer 204 has a protrusion of conductive ink 204a thereon, corresponding to the thickness of the protective film 203. Hence, the protective film 203 having a thickness suitable for formation of the protrusion of the conductive ink should be used, as mentioned above. The protrusion of the conductive ink 204a of the insulating layer 204 functions to increase the reliability of electrical connection when adhering to electrical connection portions of chips or other layers. On the completed insulating layer 204, the chips, such as passive components or active components, are mounted.

Figure 6:
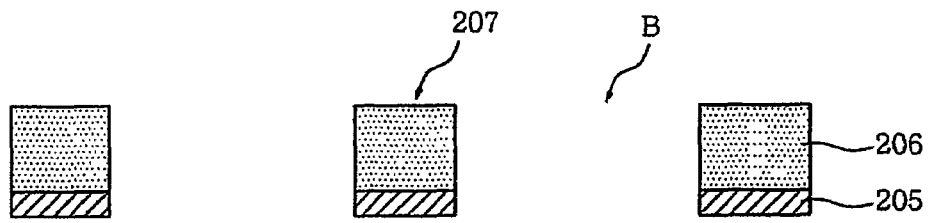
FIG. 6 is a sectional view showing a central layer having a hollow portion into which a chip is inserted, according to an embodiment of the present invention.

Separately, in FIG. 6, hollow portions B into which chips are inserted are formed through a CCL having an insulating layer 206 and a copper foil layer 205 on one surface or both surfaces thereof, whereby a central layer 207 into which chips are inserted is formed.

Preferably, the hollow portion B is formed by a mechanical drilling process or a punching process. Also, it is possible to use a laser drilling process. In this case, the hollow portion B of the copper foil layer 205 is formed by an etching process, and the hollow portion B of the insulating layer 206 is formed by a laser-irradiation process.

Thereafter, the central layer, the circuit layers, and the insulating layers are simultaneously laminated, as described below. FIGS. 7a to 7f sequentially show a simultaneous laminating process, according to the present embodiment of the invention.

Figure 7A:
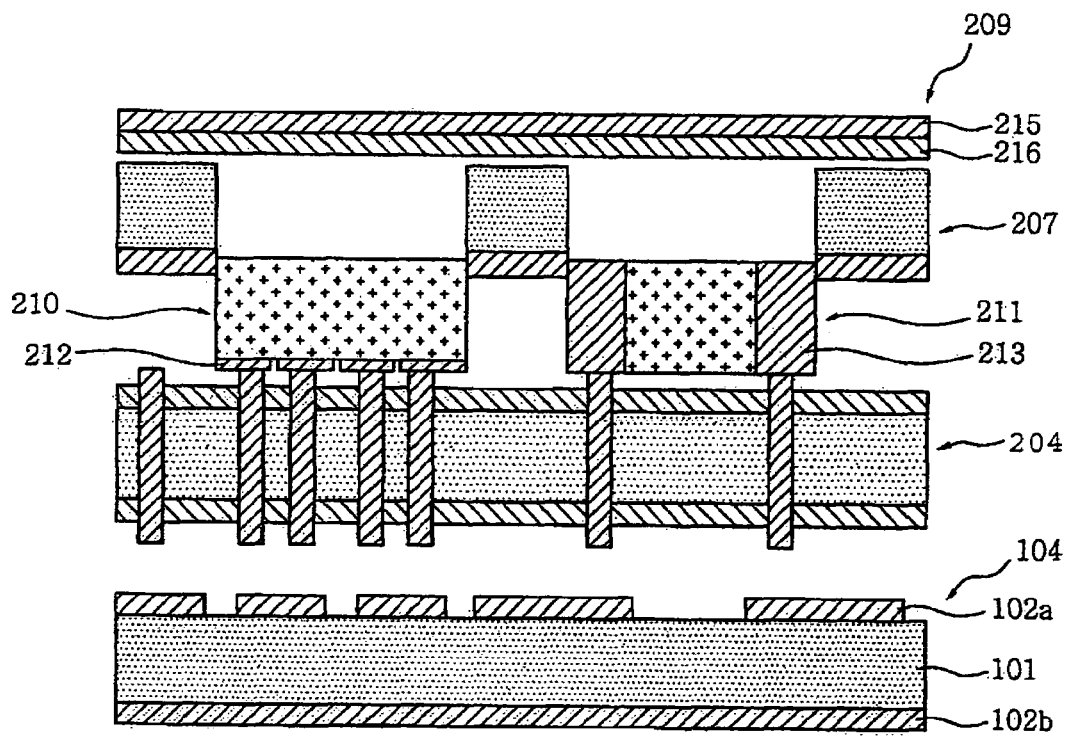
FIGS. 7a to 7f are sectional views showing a simultaneous laminating process, according to an embodiment of the present invention.

In FIG. 7a, an active component 210 and a passive component 211 are appropriately positioned on the protrusions of the conductive ink of the insulating layer 204. In this case, it is noted that an electrical connection pad 212 of the active component 210 and an electrical connection pad 213 of the passive component 211, respectively, are accurately connected to the protrusions of the conductive ink.

The central layer 207 including the hollow portions B shown in FIG. 6, the circuit layer 104 obtained by the process shown in FIGS. 4a to 4h, and a single sided CCL 209 are disposed, as shown in FIG. 7a. The single sided CCL 209 is composed of an insulating layer 216 and a copper foil layer 215 formed thereon.

Figure 7B:
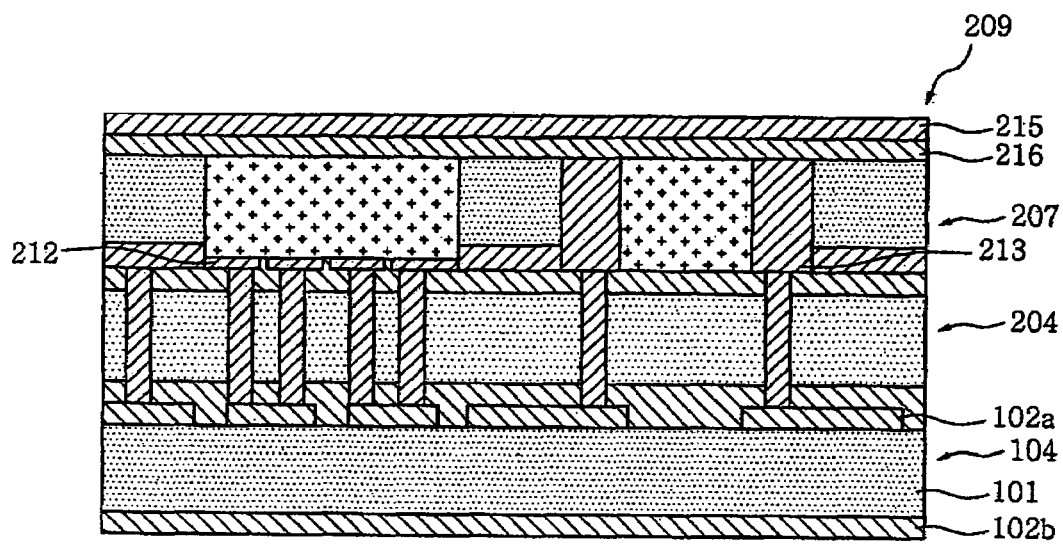

In FIG. 7b, the disposed layers are compressed from both outer surfaces thereof, and thus, are laminated. Upon compression, the active component 210 and the passive component 211 are inserted into the hollow portions B of the central layer 207, respectively. The upper protrusions of the conduction ink of the insulating layer 204 are connected to the connection pads 212 and 213 of the active component 210 and the passive component 211, respectively, while the lower protrusions of the conductive ink thereof are connected to the circuit pattern 102a of the circuit layer 104. Thereby, the active component 210 and the passive component 211 can be connected to the circuit pattern 102a by the conductive ink.

Figure 7C:
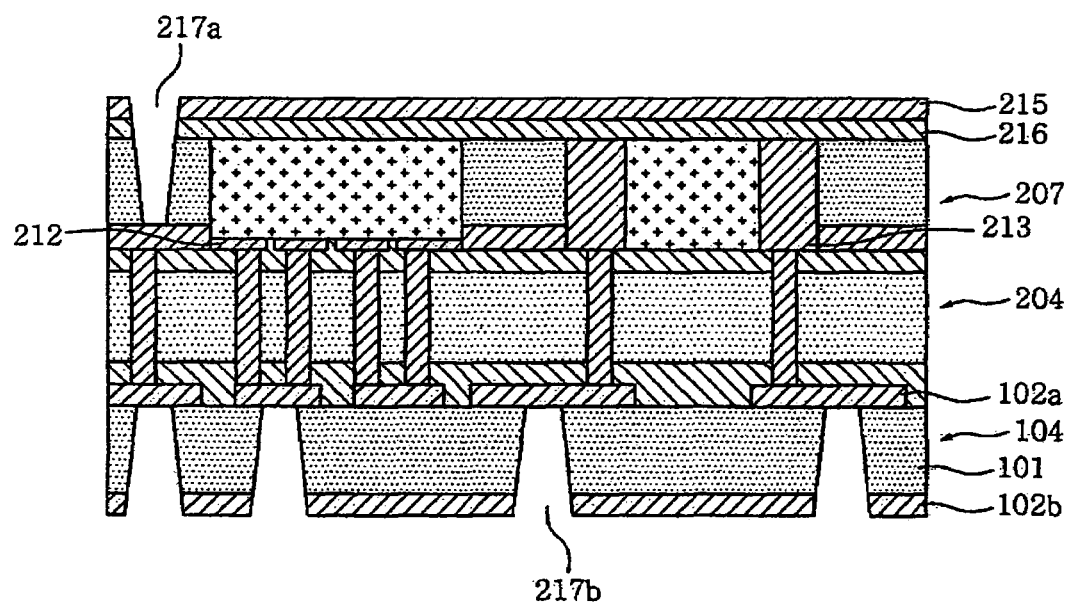

In FIG. 7c, via holes 217a and 217b are formed through outer layers by a laser drilling process.

Figure 7D:
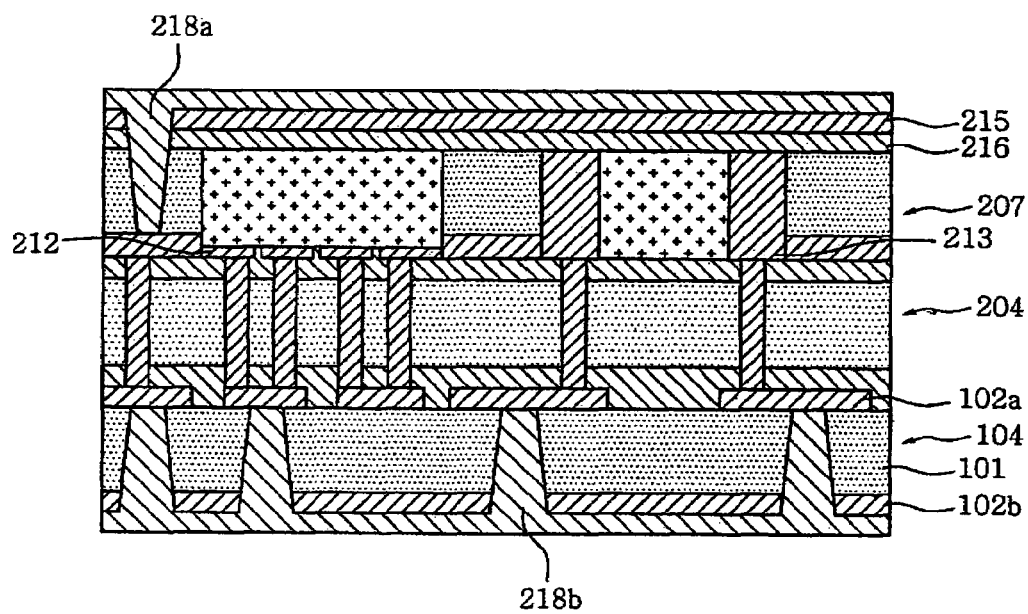

In FIG. 7d, a plating process is performed on both outer layers to form plated layers 218a and 218b, and simultaneously, the via holes 217a and 217b are filled, thereby connecting the outer copper foil layers 102b and 215 of the substrate to the inner circuits.

Figure 7E:
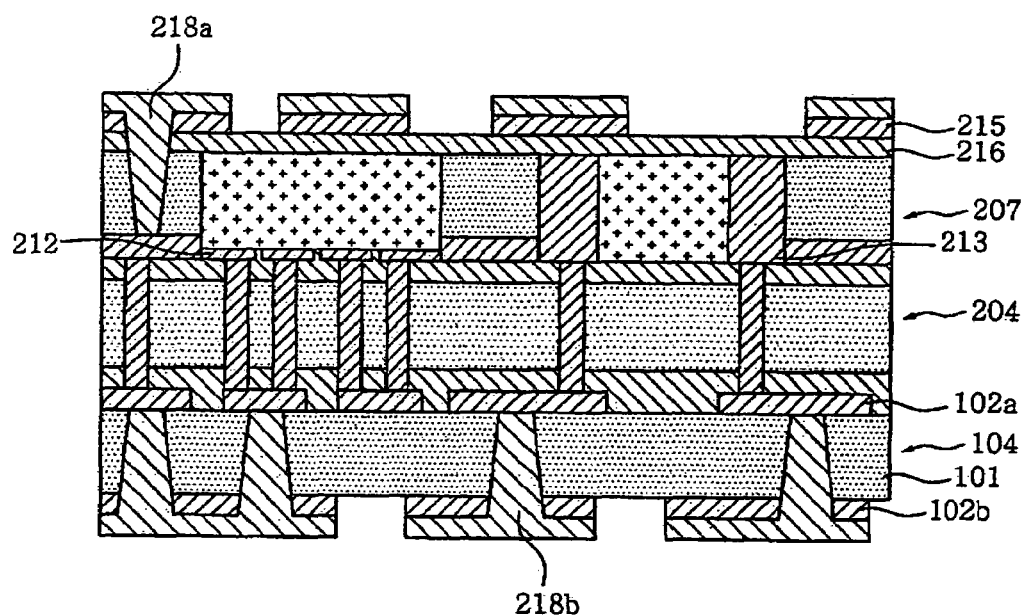

In FIG. 7e, circuit patterns are formed on the outer copper foil layers 102b and 215. To this end, an etching resist, such as a dry film, is applied on the outer layer, and exposed to light and then developed, to form an etching resist pattern, which is then etched.

Alternatively, before the single-sided CCL 209 is laminated, the circuit pattern is previously formed on the copper foil layer 215 of the CCL 209, and also, the circuit layer 104 having circuit patterns on both surfaces thereof is used, instead of using the circuit layer 104 having the circuit pattern on either surface thereof, so that the process of separately forming the circuit patterns on the outer layers may be omitted.

Figure 7F:
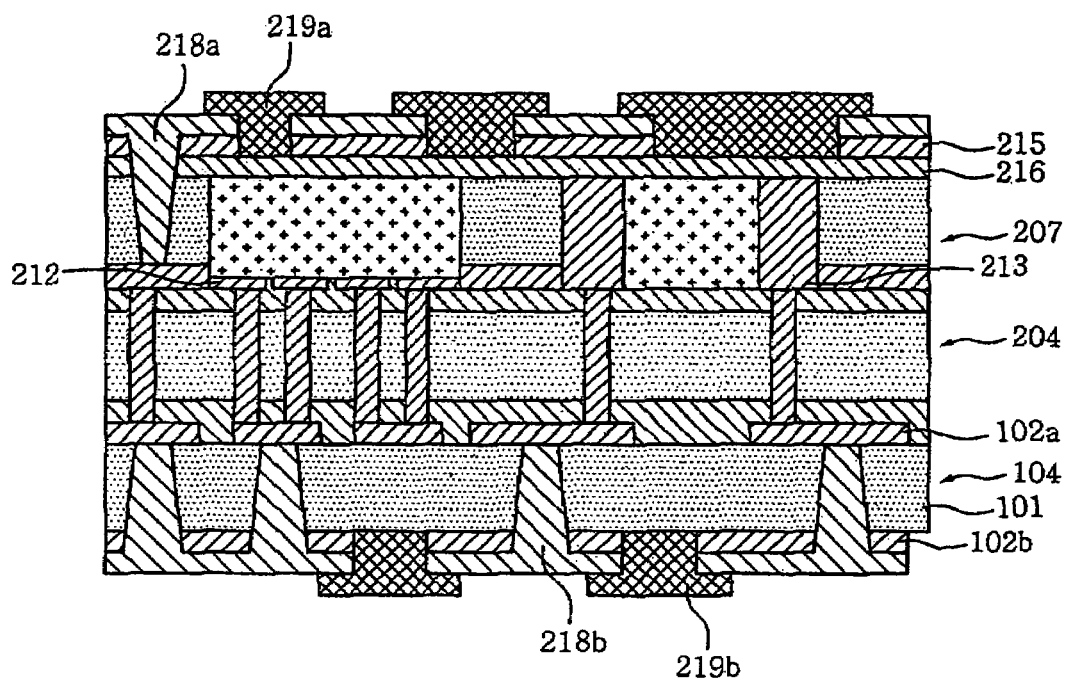

In FIG. 7f, solder resists 219a and 219b are applied on predetermined portions of the outer layers to protect the circuit patterns.

FIGS. 8a to 8f sequentially show a process of fabricating a PCB including embedded chips, according to another embodiment of the present invention.

Figure 8A:
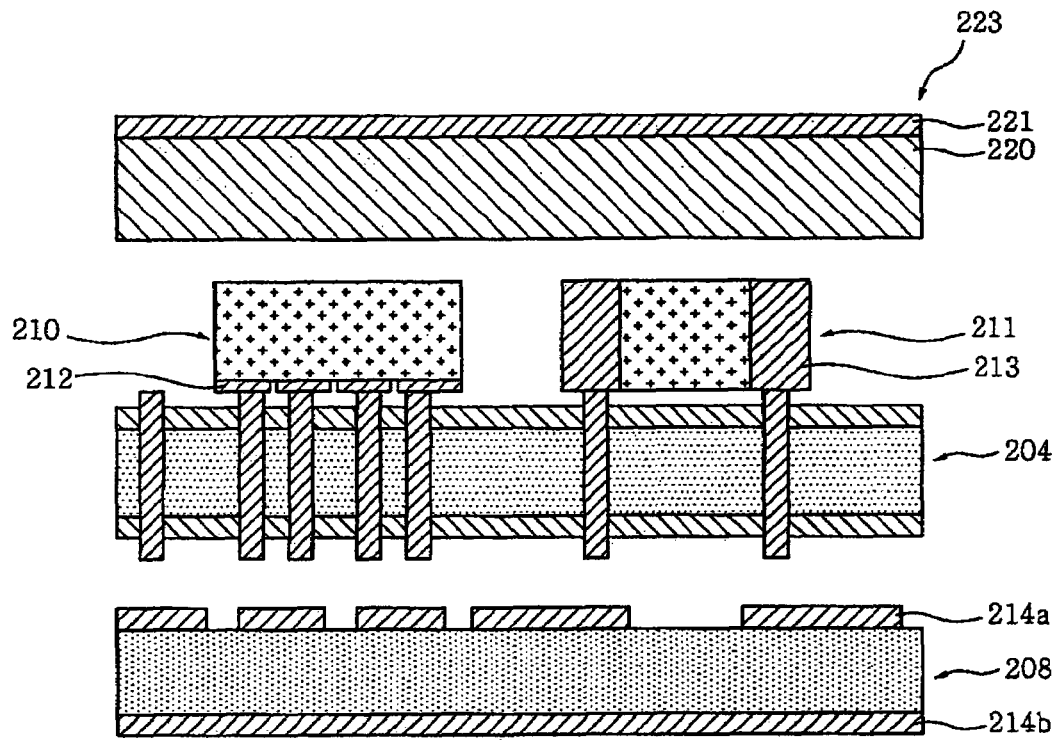
FIGS. 8a to 8f are sectional views sequentially showing a process of fabricating a PCB including embedded chips, according to another embodiment of the present invention.

In FIG. 8a, an active component 210 and a passive component 211 are appropriately positioned on protrusions of conductive ink of an insulating layer 204. At this time, it is noted that a connection pad 212 of the active component 210 and a connection pad 213 of the passive component 211 should be accurately connected to the above protrusions of the conductive ink.

The insulating layer 204 obtained by the process shown in FIGS. 5a to 5e, the circuit layer 208 formed by the process shown in FIGS. 4a to 4d, and a material layer 223 having a non-cured resin layer 220 and a copper foil layer 221 formed on one surface thereof are disposed as seen in FIG. 8a. The non-cured resin layer 220 is formed of a B-stage resin, and thus, cured into a C-stage state when being heated.

Figure 8B:
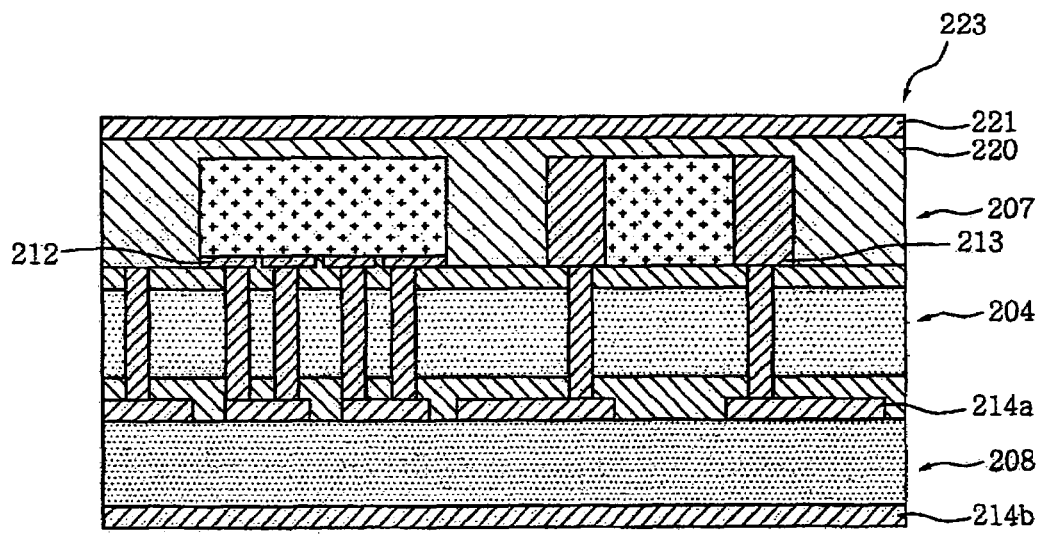

In FIG. 8b, heating and compression processes are applied to both outer surfaces of the substrate. As such, the chips 210 and 211 are embedded into the non-cured resin layer 220 of B-stage state, after which the non-cured resin layer 220 is cured by heat. Also, the upper protrusions of the conductive ink of the insulating layer 204 are connected to the connection pads 212 and 213 of the active components 210 and the passive components 211, respectively, while the lower protrusions of the conductive ink thereof are connected to the circuit pattern 214a of the circuit layer 208. Thereby, the active and passive components 210 and 211 can be connected to the circuit pattern 214a by the conductive ink of the insulating layer 204.

Figure 8C:
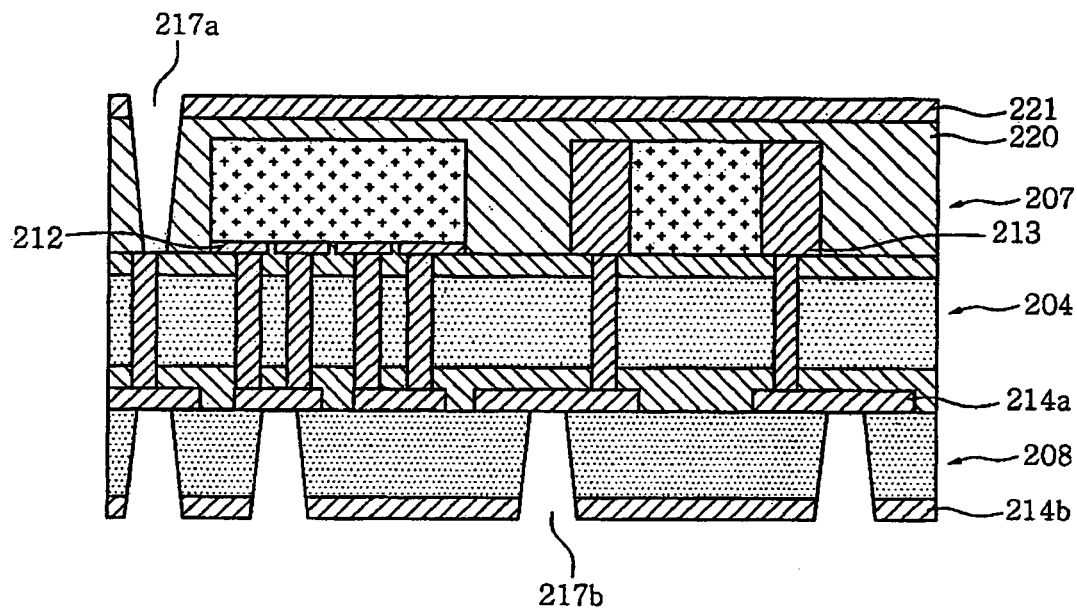

In FIG. 8c, via holes 217a and 217b are formed through the outer layers by use of a laser drilling process.

Figure 8D:
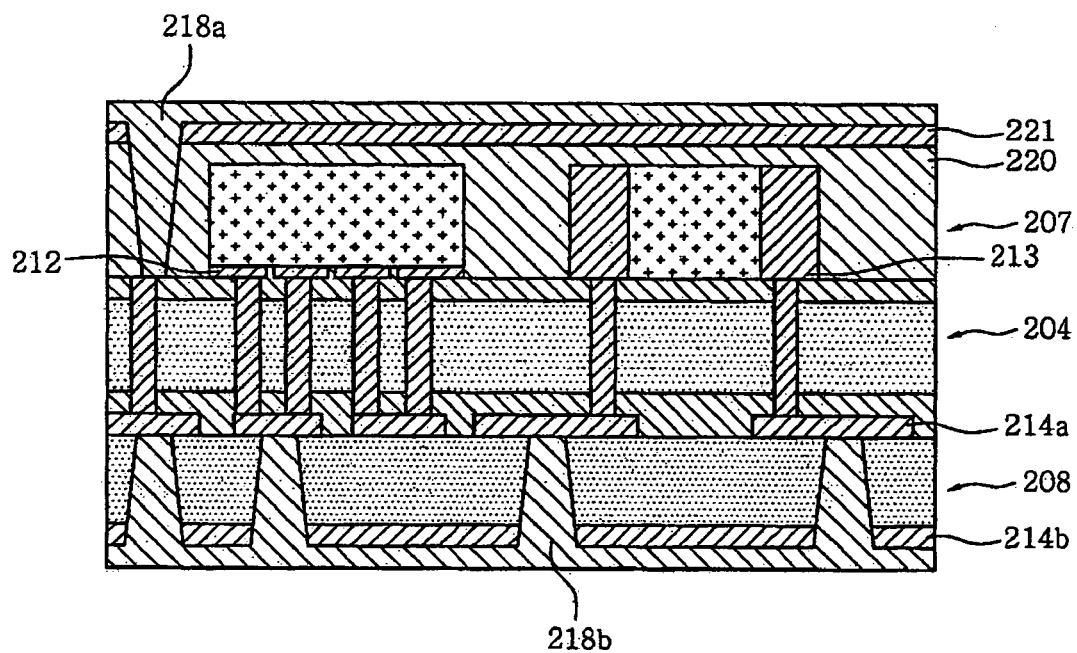

In FIG. 8d, the via holes 217a and 217b are filled by a plating process, whereby the outer copper foil layers 214b and 221 are connected to the inner circuits.

Figure 8E:
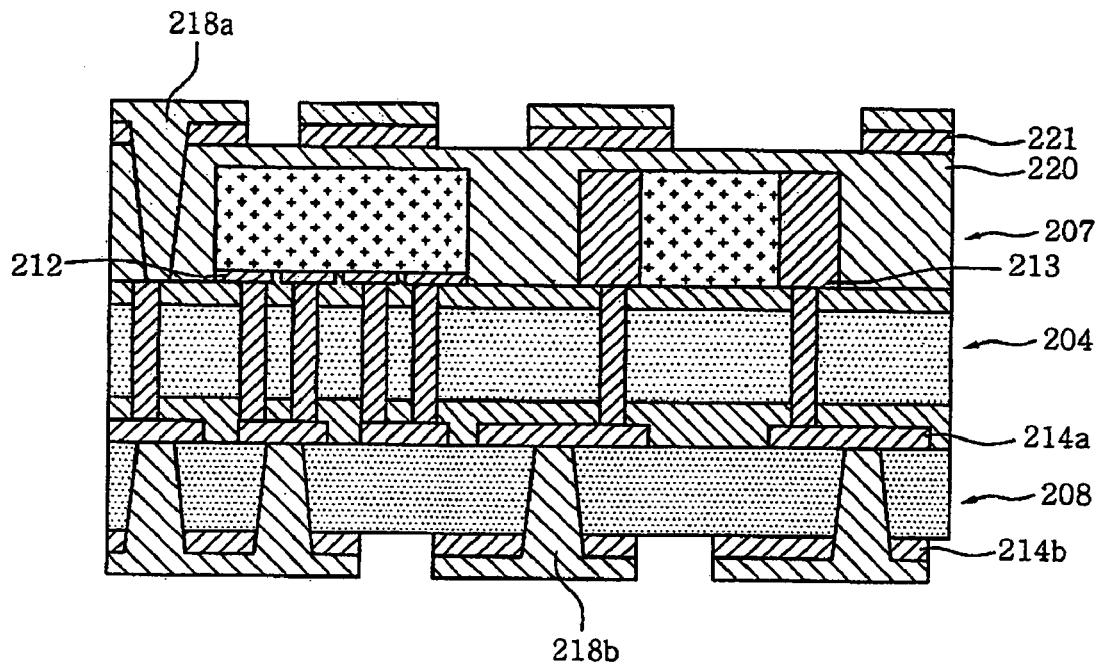

In FIG. 8e, dry films are applied on the outer copper foil layers 214b and 221, to form etching resist patterns, followed by etching, to obtain circuit patterns on the outer copper foils 214b and 221.

Figure 8F:
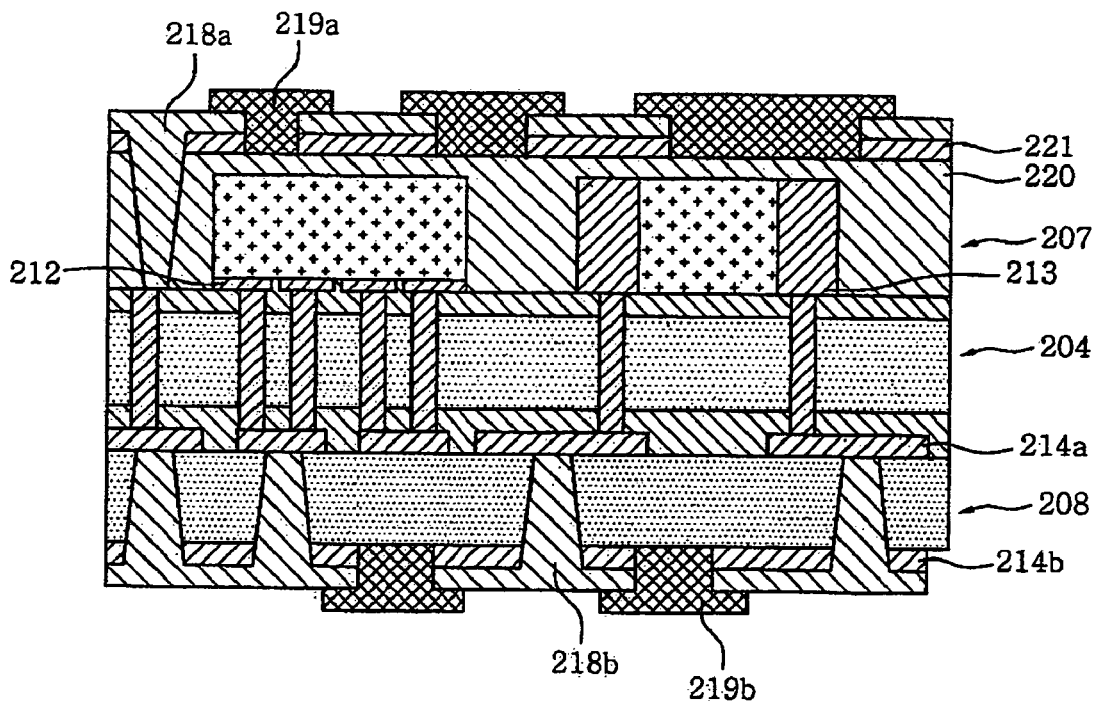

In FIG. 8f, solder resists 219a and 219b are applied on predetermined portions of the outer layers to protect the circuit patterns.

FIGS. 9a to 9f sequentially show a process of forming a central layer of a PCB including embedded chips, according to a further embodiment of the present invention.

Figure 9A:
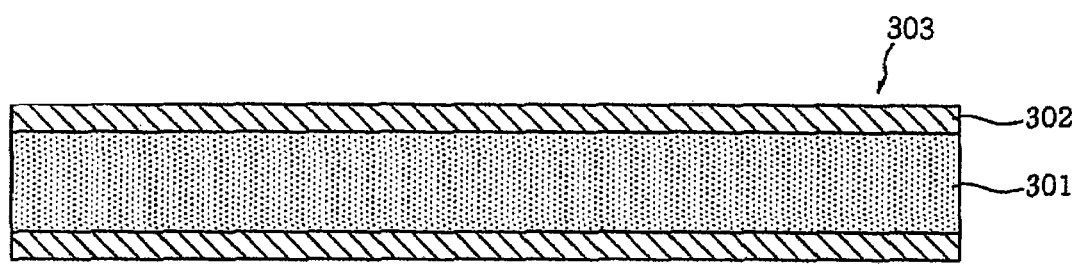
FIGS. 9a to 9f are sectional views sequentially showing a process of fabricating a central layer of a PCB including embedded chips, according to yet another embodiment of the present invention.

In FIG. 9a, a CCL 303 composed of an insulating layer 301 formed of FR-4 and copper foil layers 302 on both surfaces thereof is prepared.

Figure 9B:
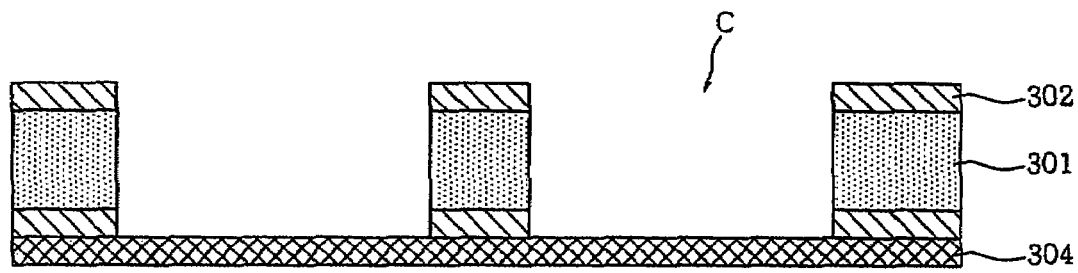

In FIG. 9b, hollow portions C are formed through the CCL 303, and an adhesive sheet 304 is attached on a lower surface of the substrate. As for the hollow portions C of the CCL 303, the hollow portions C of the copper foil layers 302 of the CCL 303 are formed by an etching process, and the hollow portions C of the insulating layer 301 of the CCL 303 are formed by a laser.

Figure 9C:
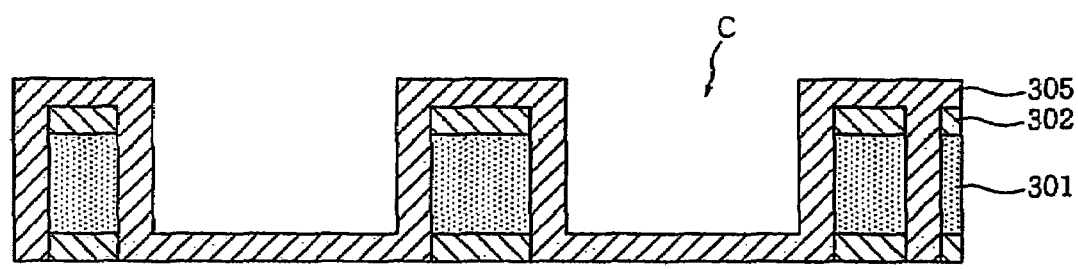

In FIG. 9c, a plating process is performed on the CCL 303 having the hollow portions C and the adhesive sheet 304 to form a plated layer 305, and the adhesive sheet 304 is removed from the plated layer 305.

Figure 9D:
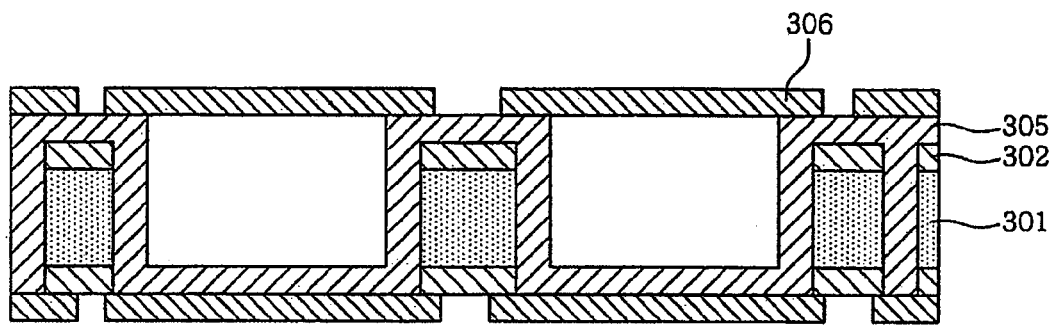

In FIG. 9d, dry films 306 as photosensitive etching resists are applied on both surfaces of the substrate, and exposed to light and then developed, to form etching resist patterns.

Figure 9E:
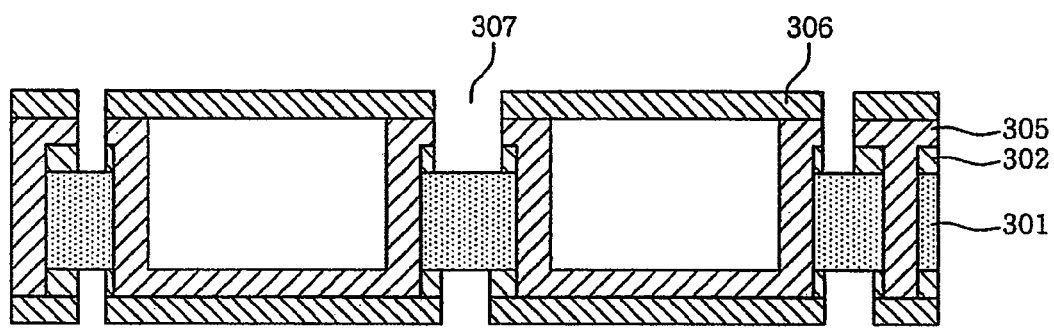

In FIG. 9e, predetermined portions 307 of the plated layer 305 are removed by an etching process, to form a circuit pattern.

Figure 9F:
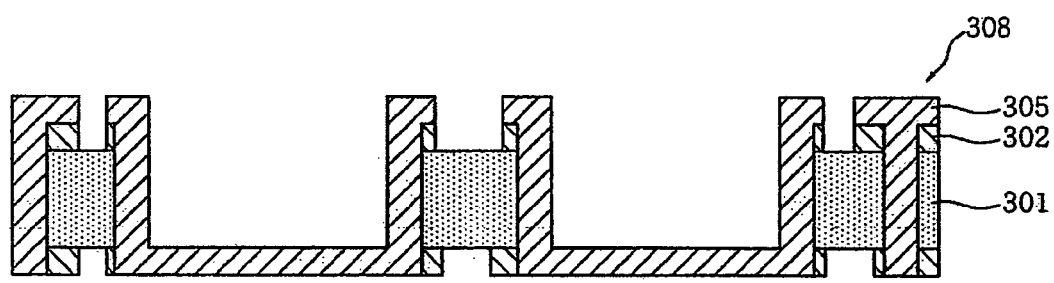

In FIG. 9f, the dry films 306 are removed using a releasing liquid, to obtain a central layer 308 having hollow portions, into which chips such as active or passive components are inserted, and having circuit patterns on both surfaces thereof.

Subsequently, the insulating layers and the circuit layers are laminated on both surfaces of the central layer 308, in accordance with a simultaneous laminating process shown in FIGS. 10a to 10c.

Figure 10A:
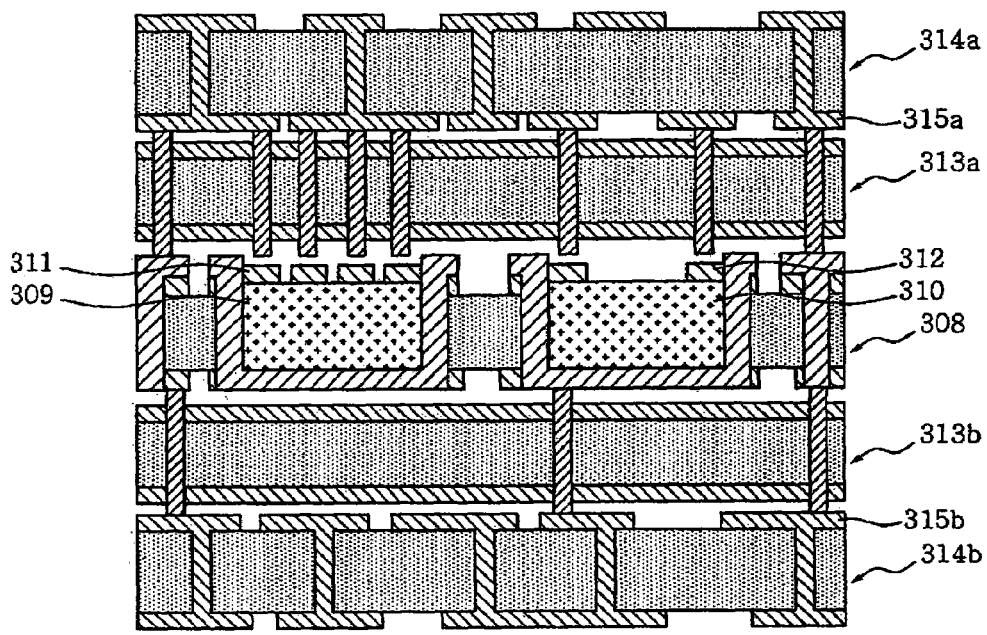
FIGS. 10a to 10c are sectional views showing a simultaneous laminating process, according to an embodiment of the present invention.

In FIG. 10a, chips including an active component 309 and a passive component 310 are inserted into the hollow portions C of the central layer 308 obtained by the process shown in FIGS. 9a to 9f, and insulating layers 313a and 313b formed by the process shown in FIGS. 5a to 5e are superimposed on both surfaces of the central layer 308. Then, circuit layers 314a and 314b having circuit patterns 315a and 315b on both surfaces thereof are superimposed on both surfaces of the insulating layers 313a and 313b.

Via holes of the insulating layer 313a are formed at positions which are connected to pads 311 and 312 of the active component 309 and the passive component 310, respectively, and are filled with conductive ink. After a compression process, the active component 309 and the passive component 310 are electrically connected to the circuit pattern 315a of the circuit layer 314a by the conductive ink.

Figure 10B:
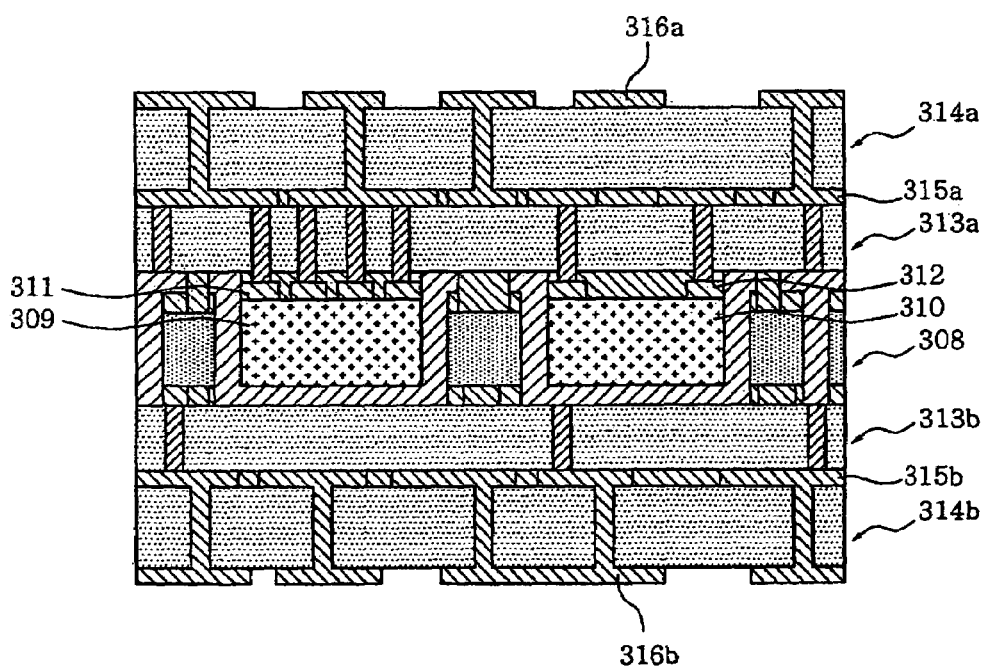

In FIG. 10b, the substrate and the layers are heated and compressed at the same time, and thus, simultaneously laminated. As such, the protrusions of the conductive ink of the insulating layers 313a and 313b are pressed by the electrode pads 311 and 312 of the active and passive components 309 and 310, respectively, and by the circuit patterns 315a and 315b of the circuit layers 314a and 314b, thereby electrically connecting them.

Alternatively, circuit patterns may be formed on one surface of each of the circuit layers 314a and 314b, after which the laminating process is completed, and then, circuit patterns may be further formed on outer copper foil layers 316a and 316b.

In the present embodiment, since the active component 309 and the passive component 310 are already inserted into the hollow portions C of the central layer 308 upon compression, displacement of the active component 309 and the passive component 310 from original positions due to the compression may be prevented. That is, the upper protrusions of the conductive ink of the insulating layers 313a and 313b can be accurately connected to the electrode pads 311 and 312 of the active and passive components 309 and 310, respectively, while the lower protrusions of the conductive ink thereof can be accurately connected to the circuit patterns 315a and 315b.

Figure 10C:
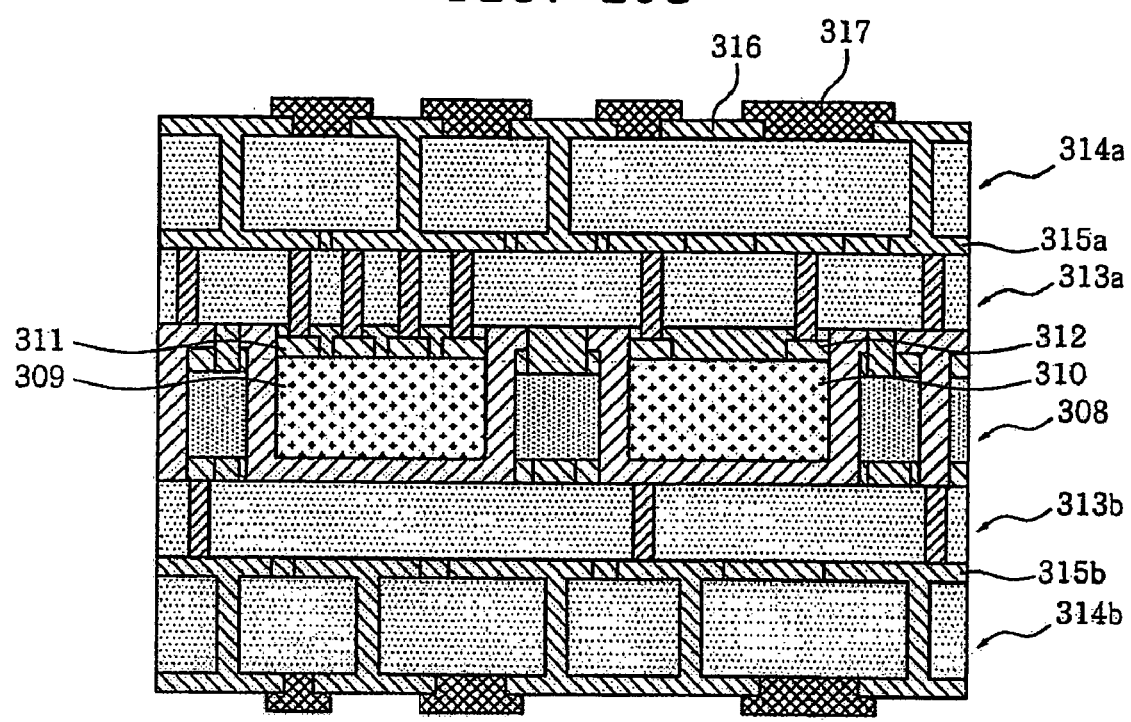

In FIG. 10c, solder resists 317 are printed at predetermined portions of the outer layers of the substrate to protect the substrate, thereby completing the multi-layered PCB including embedded chips of the active component 309 and the passive component 310.

As described above, the present invention provides a PCB including embedded chips and a fabrication method thereof. The method of fabricating the multi-layered PCB of the present invention is advantageous because interlayer electrical connection is realized while laminating the layers upon simultaneous lamination of the multi-layered PCB including embedded chips of active components and passive components, thereby drastically reducing the number of processes.

Further, the method of fabricating the multi-layered PCB of the present invention is advantageous because the positions of the chips embedded in the multi-layered PCB are fixed so as not to be moved even upon compression, and thus, it is possible to fabricate a highly reliable PCB.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a printed circuit board having embedded chips, comprising the steps of:
    preparing a circuit layer having a circuit pattern on at least one of an upper surface and a lower surface thereof;
    forming an first insulating layer having a via hole filled with conductive ink;
    preparing a copper clad laminate having a hollow portion to receive a chip;
    preparing a material layer having an second insulating layer and a copper foil layer;
    pre-laminating the circuit layer, the chip, the copper clad laminate, and the material layer on the insulating layer; and
    compressing the pre-laminated layers to connect the chip to the circuit pattern of the circuit layer and the copper foil layer of the material layer;
    wherein the step of forming the first insulating layer comprises the steps of:
        preparing a substrate having a cured resin layer, non-cured resin layers applied on both an upper and a lower surface of the cured resin layer, and protective films applied on the non-cured resin layers;
        forming a via hole at the predetermined position on the substrate;
        filling the via hole with conductive ink; and
        removing the protective films.

2. The method as set forth in claim 1, wherein the step of filling the via hole with the conductive ink comprises the step of polishing both the upper and the lower surfaces of the substrate.

3. The method as set forth in claim 1, further comprising the step of forming a via hole through an outer layer of the substrate, and a circuit pattern thereon.

4. A method of fabricating a printed circuit board having embedded chips, comprising the steps of:
    forming a circuit layer having a circuit pattern on at least one of an upper surface and a lower surface thereof;
    forming an insulating layer having a via hole filled with conductive ink;
    preparing a material layer having a non-cured resin layer and a copper foil layer;
    pre-laminating a chip on a portion filled with the conductive ink;
    pre-laminating the circuit layer and the material layer on the insulating layer; and
    compressing the pre-laminated layers, to connect the chip to the circuit pattern of the circuit layer through the via hole, and inserting the chip into the non-cured resin layer of the material layer,
    wherein the step of forming the insulating layer comprises the steps of:
        preparing a substrate having a cured resin layer, non-cured resin layers applied on both an upper and a lower surface of the cured resin layer, and protective films applied on the non-cured resin layers;
        forming a via hole at the predetermined position on the substrate;
        filling the via hole with conductive ink; and
        removing the protective films.

5. The method as set forth in claim 4, wherein the step of filling the via hole with the conductive ink comprises the step of polishing both the upper and the lower surfaces of the substrate.

6. The method as set forth in claim 4, further comprising the step of forming a via hole through an outer layer of the substrate, and a circuit pattern thereon.

7. A method of fabricating a printed circuit board having embedded chips, comprising the steps of:
- forming a central layer having an embedded chip;
- forming an insulating layer having a via hole filled with conductive ink;
- forming a circuit layer having a via hole and a circuit pattern;
- pre-laminating the central layer, the insulating layer, and the circuit layer; and
- compressing the pre-laminated layers to connect the embedded chip of the central layer to the circuit pattern of the circuit layer through the via hole;
- wherein the step of forming the insulating layer comprises the steps of:
  - preparing a substrate having a cured resin layer, non-cured resin layers applied on both an upper and a lower surface of the cured resin layer, and protective films applied on the non-cured resin layers;
  - forming a via hole at the predetermined position on the substrate;
  - filling the via hole with conductive ink; and
  - removing the protective films.

8. The method as set forth in claim 7, wherein the step of filling the via holes with the conductive ink comprises the step of polishing a projecting portion of the conductive ink.

9. The method as set forth in claim 7, wherein the step of filling the via holes with the conductive ink comprises the step of selectively filling the via holes with the conductive ink to exclude via holes used to exhaust air upon compression of the layers.

10. The method as set forth in claim 7, wherein the step of forming the circuit layer comprises the steps of:
- forming a via hole through the circuit layer; and
- forming a circuit pattern thereon.

* * * * *